(12) United States Patent
Liu et al.

(10) Patent No.: US 11,804,575 B2
(45) Date of Patent: Oct. 31, 2023

(54) MANUFACTURING METHOD OF DISPLAY PANEL, DISPLAY PANEL AND DISPLAY APPARATUS

(71) Applicant: Chengdu Vistar Optoelectronics Co., Ltd., Chengdu (CN)

(72) Inventors: Yuchun Liu, Kunshan (CN); Chih Yi Hung, Kunshan (CN); Xianrui Qian, Kunshan (CN); Yu Dou, Kunshan (CN); Huimin Li, Kunshan (CN); Chenggong Wang, Kunshan (CN)

(73) Assignee: CHENGDU VISTAR OPTOELECTRONICS CO., LTD., Chengdu (CN)

( * ) Notice: Subject to any disclaimer, the term of this patent is extended or adjusted under 35 U.S.C. 154(b) by 413 days.

(21) Appl. No.: 17/318,115

(22) Filed: May 12, 2021

(65) Prior Publication Data

US 2021/0265535 A1    Aug. 26, 2021

Related U.S. Application Data

(63) Continuation of application No. PCT/CN2019/107338, filed on Sep. 23, 2019.

(30) Foreign Application Priority Data

Mar. 29, 2019   (CN) .......................... 201910253389.3

(51) Int. Cl.
*H01L 33/50*   (2010.01)
*F21V 9/30*   (2018.01)
(Continued)

(52) U.S. Cl.
CPC .............. *H01L 33/502* (2013.01); *F21V 9/30* (2018.02); *H01L 25/0753* (2013.01);
(Continued)

(58) Field of Classification Search
CPC ....... H01L 33/502; H01L 33/44; H01L 33/58; F21Y 2115/10
See application file for complete search history.

(56) References Cited

U.S. PATENT DOCUMENTS 10,663,795 B1 * 5/2020 Chen ................. G02F 1/133606
11,562,988 B2 * 1/2023 Sang ................. G02F 1/133603
(Continued)

FOREIGN PATENT DOCUMENTS

CN    103779375 A    5/2014
CN    103840042 A    6/2014
(Continued)

OTHER PUBLICATIONS

International Search Report dated Jan. 6, 2020 in corresponding International application No. PCT/CN2019/107338; 5 pages.
(Continued)

*Primary Examiner* — Christine A Enad
(74) *Attorney, Agent, or Firm* — Maier & Maier, PLLC

(57) ABSTRACT

A manufacturing method of a display panel, a display panel, and a display apparatus. The manufacturing method includes: forming a plurality of backlight units on a process substrate; filling a partition between adjacent backlight units, where a height of the partition relative to the process substrate is greater than a height of the adjacent backlight units relative to the process substrate; preparing a filter layer on a surface of each of the plurality of backlight units away from the process substrate; stripping the backlight units with the filter layer on surfaces of the backlight units from the process substrate, and transferring to a target substrate; and packaging the target substrate.

17 Claims, 2 Drawing Sheets

(51) Int. Cl.
*H01L 25/075* (2006.01)
*F21Y 115/10* (2016.01)
*B82Y 20/00* (2011.01)

(52) U.S. Cl.
CPC ........... *B82Y 20/00* (2013.01); *F21Y 2115/10* (2016.08); *H01L 2933/0041* (2013.01)

(56) References Cited

U.S. PATENT DOCUMENTS

| | | | |
|---|---|---|---|
| 2016/0284673 A1* | 9/2016 | Kong | H01L 27/156 |
| 2018/0149936 A1* | 5/2018 | Shin | G02F 1/133524 |
| 2020/0266388 A1* | 8/2020 | Hu | H01L 33/0093 |

FOREIGN PATENT DOCUMENTS

| | | |
|---|---|---|
| CN | 204204899 U | 3/2015 |
| CN | 106449943 A | 2/2017 |
| CN | 106816502 A | 6/2017 |
| CN | 08615740 A | 10/2018 |
| CN | 108831317 A | 11/2018 |
| CN | 109037266 A | 12/2018 |
| CN | 110085618 A | 8/2019 |

OTHER PUBLICATIONS

Chinese Office Action dated Oct. 22, 2020 in corresponding Chinese application No. 201910253389.3; 7 pages.

* cited by examiner

MANUFACTURING METHOD OF DISPLAY PANEL, DISPLAY PANEL AND DISPLAY APPARATUS

CROSS-REFERENCE TO RELATED APPLICATIONS

This application is a continuation of International Application No. PCT/CN2019/107338, filed on Sep. 23, 2019. The International Application claims priority to Chinese Patent Application No. 201910253389.3, filed on Mar. 29, 2019. Both applications are hereby incorporated by reference in their entireties.

TECHNICAL FIELD

The present application relates to the field of display technologies, and in particular to a manufacturing method of a display panel, a display panel and a display apparatus.

BACKGROUND

At present, display panels have been widely used in many fields such as portable electronic devices (for example, mobile communication terminals, tablet computers, e-books, and navigation equipments) and large-screen electronic apparatuses. Among them, the display panels can be divided into photoluminescence display panels and electroluminescence display panels according to their light emission principles. In recent years, photoluminescence display panels using a quantum dot (QD) luminescent material have become more widely used. The quantum dot luminescent material is a new technology applied in the field of display panels. The quantum dot luminescent material complies with the quantum size effect, and their properties change with the size of quantum dots. When stimulated by light or electricity, the quantum dot luminescent material emits colored light, and the color of the light is related to its property. Therefore, the emitted light by quantum dot luminescent material can be controlled by changing the size of the quantum dot luminescent material. The quantum dot luminescent material has the advantages of such as concentrated luminescence spectrum, high color purity and wide color gamut. The application of the quantum dot luminescent material in the field of display panels can greatly increase the color gamut of the display panels and enhance the color reproduction ability of the display panels.

However, in a method of preparing a quantum dot material layer on a backlight unit, there is at least a problem that the thickness and area of the quantum dot material layer are difficult to control, which affects the display effect.

SUMMARY

In order to overcome the above-mentioned drawback, an object of the present application is to provide a manufacturing method of a display panel, a display panel and a display apparatus. The present application can effectively improves display effect of the display panel, reduce material waste, and improve production efficiency.

A first aspect of the present application provides a manufacturing method of a display panel, including:
   forming a plurality of backlight units on a process substrate;
   filling a partition between adjacent backlight units, where a height of the partition relative to the process substrate is greater than a height of the adjacent backlight units relative to the process substrate;
   preparing a filter layer on a surface of each of the plurality of backlight units away from the process substrate; where a sum of heights of the filter layer and a corresponding backlight unit relative to the process substrate is less than or equal to the height of the partition relative to the process substrate;
   stripping the backlight units with the filter layer on the surfaces from the process substrate, and transferring to a target substrate; and
   packaging the target substrate.

In the present application, the partition is filled between adjacent backlight units to make the partition higher than the backlight unit, thereby limiting the thickness and area of the filter layer. Since the light conversion efficiency of a quantum dot material is affected by its thickness and area, a precise control of the thickness and area of the filter layer can make the quantum dot material in a better light conversion form, which is beneficial to improve the display effect of the display panel.

In addition, the partition can also restrict flow of the quantum dot material and a transparent material, so that the quantum dot material and the transparent material will not flow into a gap between adjacent backlight units, thereby reducing material waste, eliminating a step for cleaning the substrate and improving production efficiency.

In the manufacturing method of a display panel as described above, in one embodiment, the step of forming the plurality of backlight units on the process substrate includes:
   bonding and fixing the plurality of backlight units onto the process substrate by a bonding glue respectively.

In the manufacturing method of a display panel as described above, in one embodiment, the bonding glue includes one or more of polycarbonate, polyolefin mixture, polyimide, and cycloolefin polymer.

The bonding glue can provide a stable adhesive force for the backlight units and facilitate subsequent debonding.

A second aspect of the present application provides a display panel provided according to the manufacturing method of a display panel of the first aspect and any of the embodiments thereof. The display panel provided by the above-mentioned manufacturing method of a display panel has good display effect.

A third aspect of the present application provides a display apparatus, including the display panel as described in the second aspect. The display apparatus including the above display panel has a good display effect.

DETAILED DESCRIPTION OF THE EMBODIMENTS

In order to make the purposes, technical solutions and advantages of the embodiments of the present application clearer, the technical solutions in the embodiments of the present application will be described clearly and completely in conjunction with the drawings in the embodiments of the present application. Obviously, the described embodiments are some of the embodiments of the present application, but not all the embodiments.

Based on the embodiments in the present application, all other embodiments obtained by those of ordinary skill in the art without creative efforts fall within the protection scope of the present application. In the case of no conflict, the following embodiments and features in the embodiments can be combined with each other.

A display panel is generally provided by the following method: first, a substrate is provided, and a plurality of backlight units are provided on the substrate. Then, a quantum dot material or a transparent material is printed on the surfaces of the backlight units away from the substrate by inkjet printing; specifically, a full color display of the display panel can be realized by printing multiple times and printing a single-color material every time. Finally, the above-mentioned substrate is packaged with a package cover to form the display panel.

However, the inventor found that in the manufacturing method of directly printing the quantum dot material or the transparent material on the backlight units, since the material is printed on the backlight units in a fluid form, its thickness and area after final curing is not easy to control and the uneven thickness will affect the light conversion efficiency and the display effect of the display panel; in addition, due to a gap between adjacent backlight units, some of the material printed on the surface of the backlight units will flow into the gap, which will cause material waste and a need for subsequent cleaning, seriously affecting production efficiency.

Embodiment I

Figure 1:
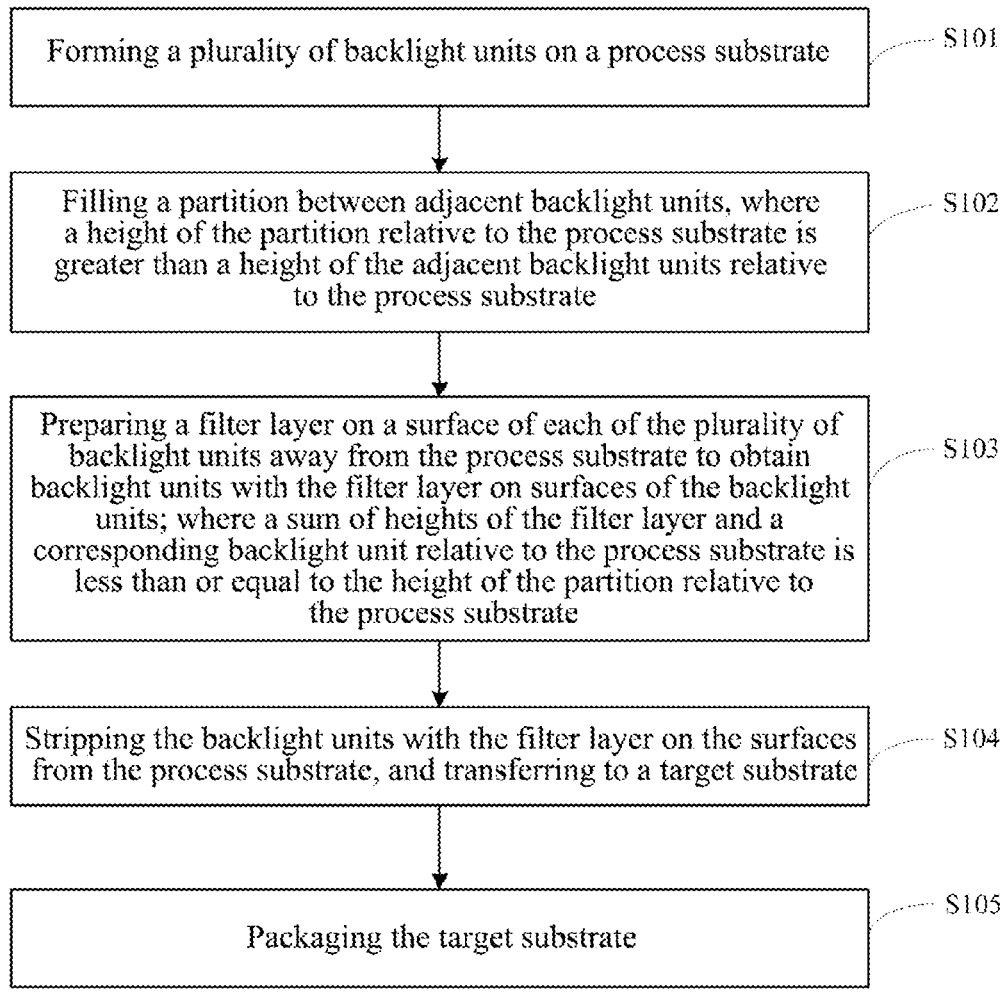
FIG. 1 is a flowchart of a manufacturing method of a display panel provided by an embodiment of the present application.

FIG. 1 is a flowchart of a manufacturing method of a display panel provided by an embodiment of the application; please refer to FIG. 1. This embodiment provides a manufacturing method of a display panel, including:

S101: forming a plurality of backlight units on a process substrate;

S102: filling a partition between adjacent backlight units, where a height of the partition relative to the process substrate is greater than a height of the adjacent backlight units relative to the process substrate;

S103: preparing a filter layer on a surface of each of the plurality of backlight units away from the process substrate to obtain backlight units with the filter layer on surfaces of the backlight units; where the filter layer includes a red quantum dot material layer and a green quantum dot material layer, the filter layer further includes a blue quantum dot material layer or a transparent material layer, and a sum of heights of the filter layer and a corresponding backlight unit relative to the process substrate is less than or equal to the height of the partition relative to the process substrate;

S104: stripping the backlight units with the filter layer on the surfaces from the process substrate, and transferring to a target substrate;

S105: packaging the target substrate.

It can be understood that heights of the partition, the backlight unit and the filter layer relative to the process substrate are thicknesses of the partition, the backlight unit and the filter layer in a direction perpendicular to the process substrate.

In this embodiment, the partition is filled between adjacent backlight units to make the partition higher than the backlight unit, thereby limiting the thickness and area of the filter layer. Since the light conversion efficiency of the quantum dot material is affected by its thickness and area, a precise control of the thickness and area of the filter layer can make the quantum dot material in a better light conversion form, which is beneficial to improve the display effect of the display panel.

In addition, the partition can also restrict flow of the quantum dot material and the transparent material, so that the quantum dot material and the transparent material will not flow into a gap between adjacent backlight units, thereby reducing material waste, eliminating a step for cleaning the substrate and improving production efficiency.

The thickness in this embodiment refers to a vertical distance from a side of the filter layer or the partition away from the process substrate to the process substrate.

It is clear to those skilled in the art that when the backlight units use a blue light emitting diode (LED), the filter layer includes at least three kinds: a red quantum dot material layer, a green quantum dot material layer, and a transparent material layer, to achieve full-color display of the display panel; where a material of the transparent material layer can be selected from an organic material such as epoxy resin, polyvinyl alcohol, polyurethane acrylate polymer, polyimide resin, and a modified material thereof. When the backlight units adopt ultraviolet LEDs, the filter layer includes at least three kinds: a red quantum dot material layer, a green quantum dot material layer and a blue quantum dot material layer, to realize the full-color display of the display panel.

Figure 2A:
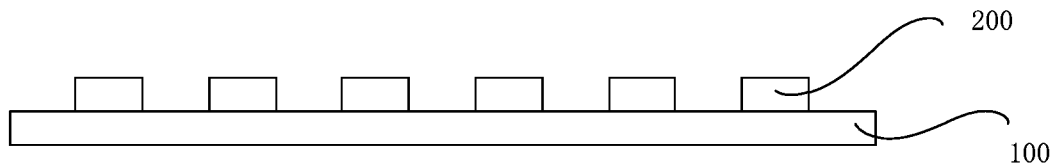
FIG. 2(a) is a schematic structural diagram corresponding to a step in a manufacturing method of a display panel provided by an embodiment of the present application.

In order to make the method steps of this embodiment easier to understand, the method of this embodiment will be further explained below in conjunction with FIGS. 2(a)-2(e):

FIGS. 2(a)-2(e) show an optional specific implementation method of this embodiment, including:

Step 1: as shown in FIG. 2(a), forming a plurality of backlight units 200 on a process substrate 100.

Where the backlight unit 200 may be fixed on the process substrate 100 by a bonding glue. The bonding glue can provide a stable adhesive force for the backlight units 200 and facilitate subsequent debonding.

The process substrate 100 may be selected from, for example, a glass substrate, a polyimide substrate, or the like. The backlight unit 200 can be selected from a blue LED or an ultraviolet LED. The technology of using the blue LED or ultraviolet LED as the backlight source is relatively mature and stable, and can ensure the display effect of the display panel.

Figure 2B:
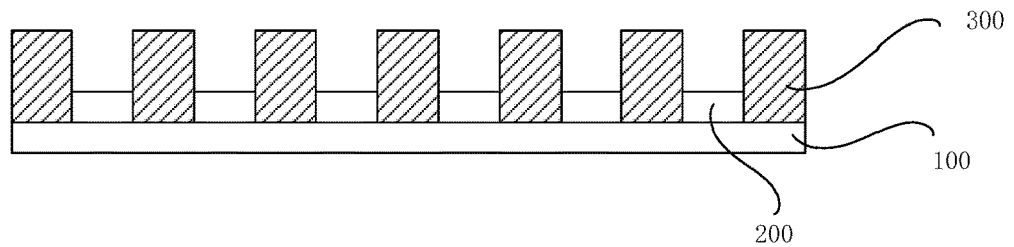
FIG. 2(b) is a schematic structural diagram corresponding to a step in a manufacturing method of a display panel provided by an embodiment of the present application.

Step 2: as shown in FIG. 2(b), filling a partition 300 between adjacent backlight units 200 where a height of the partition 300 relative to the process substrate 100 is greater than a height of the adjacent backlight unit 200 relative to the process substrate 100.

As shown in FIG. 2(b), according to the number of the backlight units 200, the partition 300 can be arranged on the process substrate 100. The partition 300 mainly functions as limiting filling area and thickness of a subsequent material. Therefore, a spacing between adjacent partitions 300 and a height the partition 300 relative to the process substrate 100 can be set according to a specific condition. In addition, a material of the partition 300 can be selected in a wide range, such as polyimide material, metal oxide material, or black photoresist film material. In one embodiment, the partition 300 is a black matrix, that is, it is made of a metal oxide material or a black photoresist film material used in the black matrix. The partition 300 preferably uses a black matrix material to reduce research and development cost.

In order to reduce the influence of the manufacturing of the partition 300 on a backlight unit 200 that has been provided on the process substrate 100, the backlight units 200 preferably adopt backlight units with a side wall protective layer, which can further reduce light leakage of the backlight units and reduce an influence of the manufacturing process of the filter layer on the backlight units.

When the quantum dot material layer is irradiated by ultraviolet light or blue light, its electrons will be excited to jump from a ground state to a higher energy level, and then emit light with a certain wavelength through radiation transition. Due to the energy loss in the whole process, the absorption conversion efficiency of the quantum dot material layer directly affects the intensity of light emitted after conversion. In display applications, a blue light absorption rate of the quantum dot material layer increases as the thickness of the quantum dot material layer increases. In order to reduce the blue light transmittance and improve the absorption efficiency, it is necessary to ensure that the quantum dot material layer has a certain thickness; but if the thickness of the quantum dot material layer is too thick, it will affect the emission of converted light. Therefore, controlling the thickness and area of the quantum dot material layer is beneficial to improve the display effect of the display panel.

In this embodiment, the partition 300 is adopted. By selecting the spacing between adjacent partitions 300 and the height of the partition 300 relative to the process substrate 100, the thickness and area of the provided filter layer can be limited, thereby effectively ensuring the display effect of the display panel.

Figure 2C:
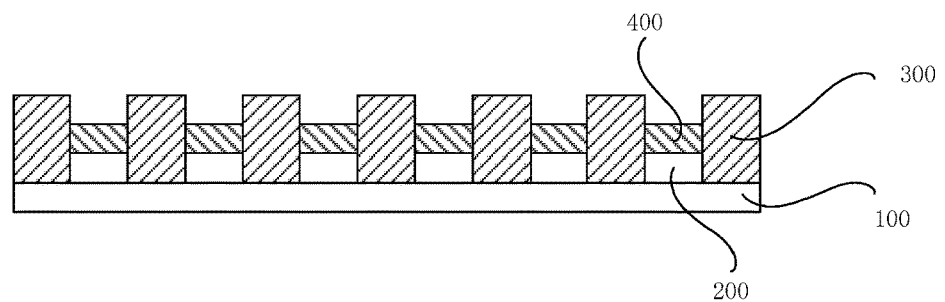
FIG. 2(c) is a schematic structural diagram corresponding to a step in a manufacturing method of a display panel provided by an embodiment of the present application.

Step 3: as shown in FIG. 2(c), preparing a filter layer 400, where the filter layer 400 is provided on a surface of each of the plurality of backlight units 200 away from the process substrate 100 to obtain backlight units 200 with the filter layer 400 on surfaces of the backlight units; a sum of heights of the filter layer 400 and a corresponding backlight unit 200 relative to the process substrate 100 is less than or equal to the height of the partition 300 relative to the process substrate 100.

Where before the step of preparing the filter layer 400 on the surface of each of the plurality of backlight units 200 away from the process substrate 100, further includes:
performing laser thinning on the surface of the plurality of backlight unit 200 away from the process substrate 100;
performing a plasma surface treatment on the backlight unit 200 after laser thinning.

The thickness of each backlight unit 200 can be made uniform by laser thinning, thereby improving the manufacturing accuracy; the plasma treatment of the thinned backlight unit 200 can enhance the affinity between the quantum dot material and the transparent material and the backlight unit 200, and facilitate the bonding of the two.

In this embodiment, the backlight units 200 preferably adopt Micro-LEDs, and a size of the backlight units 200 ranges from 10 microns to 5000 microns, and preferably ranges from 30 microns to 1000 microns.

In one embodiment, the step of preparing the filter layer 400 on the surface of each of the plurality of backlight units 200 away from the process substrate 100 includes: preparing the filter layer 400 on the surface of each of the plurality of backlight units 200 away from the process substrate 100 by inkjet printing.

The inkjet printing method has low cost, is mature and stable in technology, and has high production efficiency.

In another embodiment, the step of preparing the filter layer 400 on the surface of each of the plurality of backlight units 200 away from the process substrate 100 includes: preparing the filter layer 400 on the surface of each of the plurality of backlight units 200 away from the process substrate 100 by coating a photoresist on the process substrate 100 and performing photolithography.

The photolithography method has a high manufacturing accuracy, and can realize the manufacturing of a smaller-sized light-emitting unit, improving the display effect of the display panel.

In yet another embodiment, the step of preparing the filter layer 400 on the surface of each of the plurality of backlight units 200 away from the process substrate 100 includes:
covering the process substrate 100 with a mask, where the mask is provided with through holes corresponding to the backlight units 200 one to one;
coating the quantum dot material or transparent material with a color corresponding to the backlight units 200 on the backlight units 200, and curing;
removing the mask.

Specifically, when the backlight units adopt blue LEDs, through holes respectively corresponding to the red quantum dot material layer, the green quantum dot material layer and the transparent material layer (when the backlight units are ultraviolet LEDs, the transparent material layer here can be a blue quantum dot material layer) can be produced on the mask. After the mask is covered on the process substrate 100, it is only necessary to coat quantum dot materials or transparent material with corresponding colors into the corresponding through holes. The coating can be carried out in three times, that is, only the red quantum dot material is coated for the first time, only the green quantum dot material is coated for the second time, and only the transparent material or blue quantum dot material is coated for the third time; unified curing operations can be performed after coating to reduce the number of curing.

In this embodiment, the filter layer 400 is fabricated by a mask, which can effectively control the thickness of the filter layer 400, and at the same time, the use of the coating process can improve the manufacturing efficiency of the filter layer 400.

In another embodiment, the step of preparing the filter layer 400 on the surface of each of the plurality of backlight units 200 away from the process substrate 100 includes:
coating a quantum dot material or a transparent material on a transparent substrate provided with a stripping adhesive layer;
aligning the transparent substrate with the process substrate 100, and irradiating the transparent substrate with a laser, so that the quantum dot material or the transparent material at a laser irradiation position is separated from the transparent substrate and bonded with a corresponding backlight unit 200; where an area of a laser spot is the same as a projection area of a corresponding backlight unit 200 on the process substrate 100.

Specifically, three transparent substrates with stripping adhesive layers on surfaces thereof can be taken, and a red quantum dot material layer, a green quantum dot material layer, and a transparent material layer can be fabricated on the three transparent substrates (a blue quantum dot material layer when the backlight units are ultraviolet LEDs) respectively. In one embodiment, widths of material layers are consistent with widths of the backlight units. In another embodiment, areas of the material layers are greater than or equal to areas of the backlight units, that is, after the transparent substrate is aligned with the process substrate 100, projection areas of the material layers on the process substrate 100 cover (greater than or equal to) projection areas of the backlight units 200 on the process substrate 100.

The laser is used to irradiate each material layer vertically on the back of the transparent substrate, and a spot area of the laser is controlled to be the same as a projection area of a corresponding backlight unit 200 on the process substrate 100, so that a stripped quantum dot material block or transparent material block is matched with a corresponding backlight unit 200.

Finally, the stripped quantum dot material block or transparent material block is bonded to the corresponding backlight unit 200.

In this embodiment, the manufacturing of the filter layer 400 is carried out on the transparent substrate, which can reduce an influence on the backlight unit 200 during the manufacturing of the filter layer 400; meanwhile, laser processing can accurately control the size of the filter layer 400 and improve the process accuracy.

Figure 2D:
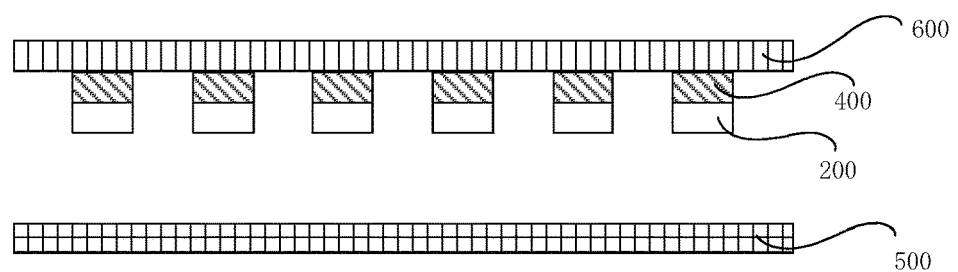
FIG. 2(d) is a schematic structural diagram corresponding to a step in a manufacturing method of a display panel provided by an embodiment of the present application.

Step 4: as shown in FIG. 2(d), stripping the backlight units 200 with the filter layer 400 on the surfaces from the process substrate 100 and transferring to a target substrate 500.

Where the step of stripping the backlight units 200 with the filter layer 400 on the surfaces from the process substrate 100 includes:

debonding the bonding glue by laser heating.

Because the laser has high energy, an efficiency of the debonding can be ensured.

The bonding glue in this embodiment includes one or more of polycarbonate, polyolefin mixture, polyimide, and cycloolefin polymer.

Further, the step of transferring the backlight units 200 with the filter layer 400 on the surfaces to the target substrate 500 includes:

moving the backlight units 200 with the filter layer 400 on the surfaces from the process substrate 100 to the target substrate 500 by a adsorption device 600 with a adsorption head; and electrically connecting the backlight units 200 with the filter layer 400 on the surfaces to an electrode on the target substrate 500.

In one embodiment, the adsorption head may be an electrostatic adsorption head, a magnetic adsorption head or a vacuum adsorption head.

Adopting the adsorption device 600 with the electrostatic adsorption head, the magnetic adsorption head or the vacuum adsorption head for transfer can ensure the accuracy of transfer.

The electrical connections between the backlight units 200 and the electrode on the target substrate 500 can ensure the normal light emission control of the backlight units by the substrate.

Figure 2E:
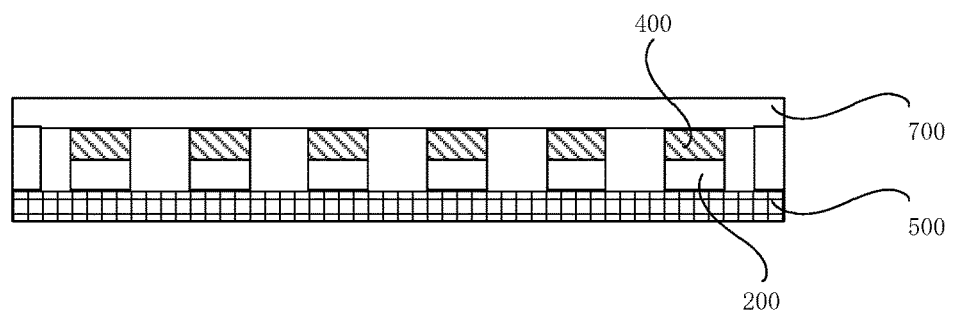
FIG. 2(e) is a schematic structural diagram corresponding to a step in a manufacturing method of a display panel provided by an embodiment of the present application.

Step 5: as shown in FIG. 2(e), packaging the target substrate 500 to obtain a display panel.

Where the packaging layer 700 may be a glass cover plate or a transparent organic film, and it has no further limitation in this embodiment. The packaging layer 700 is generally bonded with the target substrate 500 through a packaging glue, to perform packaging.

Through the above steps, the display panel provided in this embodiment can effectively improve the display effect of the display panel, reduce material waste, and improve production efficiency.

Embodiment II

This embodiment provides a display panel, which is manufactured using the manufacturing method of the display panel described in Embodiment I.

The display panel provided in this embodiment can effectively improve the display effect of the display panel, reduce material waste, and improve production efficiency.

Embodiment III

This embodiment provides a display apparatus including the display panel described in Embodiment II.

The display apparatus provided in this embodiment can effectively improve the display effect of the display panel, reduce material waste, and improve production efficiency.

Finally, it should be noted that the above embodiments are only used to illustrate the technical solutions of the present application, not to limit it; although the present application has been described in detail with reference to the foregoing embodiments, those of ordinary skill in the art should understand: they still can modify the technical solutions described in the foregoing embodiments, or equivalently replace some or all of the technical features; these modifications or replacements do not make the essence of the corresponding technical solutions deviate from the scope of the technical solutions of the embodiments of the present application.

What is claimed is:

1. A manufacturing method of a display panel, comprising:

forming a plurality of backlight units on a process substrate;

filling a partition between adjacent backlight units, wherein a height of the partition relative to the process substrate is greater than a height of the adjacent backlight units relative to the process substrate;

preparing a filter layer on a surface of each of the plurality of backlight units away from the process substrate to obtain backlight units with the filter layer on surfaces of the backlight units; wherein a sum of heights of the filter layer and a corresponding backlight unit relative to the process substrate is less than or equal to the height of the partition relative to the process substrate;

stripping the backlight units with the filter layer on the surfaces from the process substrate, and transferring to a target substrate; and packaging the target substrate.

2. The manufacturing method of a display panel according to claim 1, wherein the forming of the plurality of backlight units on the process substrate comprises:

bonding and fixing the plurality of backlight units onto the process substrate by a bonding glue.

3. The manufacturing method of a display panel according to claim 2, wherein the bonding glue comprises one or more of polycarbonate, polyolefin mixture, polyimide, and cycloolefin polymer.

4. The manufacturing method of a display panel according to claim 1, wherein before the preparing of the filter layer on the surface of each of the plurality of backlight units away from the process substrate, the method further comprises:

performing laser thinning on the surfaces of the plurality of backlight units away from the process substrate.

5. The manufacturing method of a display panel according to claim 4, wherein after the performing laser thinning on the surfaces of the plurality of backlight units away from the process substrate, the method further comprises:

performing a plasma surface treatment on the plurality of backlight units after the laser thinning.

6. The manufacturing method of a display panel according to claim 1, wherein the providing of the filter layer on the surface of each of the plurality of backlight units away from the process substrate comprises:

providing the filter layer on the surface of each of the plurality of backlight units away from the process substrate by inkjet printing.

7. The manufacturing method of a display panel according to claim 1, wherein the providing of the filter layer on the surface of each of the plurality of backlight units away from the process substrate comprises:

providing the filter layer on the surface of each of the plurality of backlight units away from the process substrate by coating a photoresist on the process substrate and by performing photolithography.

8. The manufacturing method of a display panel according claim 1, wherein the preparing of the filter layer on the surface of each of the plurality of backlight units away from the process substrate comprises:

covering the process substrate with a mask, wherein the mask is provided with a plurality of through holes corresponding to the plurality of backlight units one to one; and coating a quantum dot material or a transparent material with a color corresponding to the backlight units onto the backlight units, and curing; and removing the mask.

9. The manufacturing method of a display panel according to claim 1, wherein the preparing of the filter layer on the surface of each of the plurality of backlight units away from the process substrate comprises:

coating a quantum dot material or a transparent material on a transparent substrate provided with a stripping adhesive layer; and aligning the transparent substrate with the process substrate, and irradiating the transparent substrate with a laser, so that the quantum dot material or the transparent material at a laser irradiation position is separated from the transparent substrate and bonded with a corresponding backlight unit;

wherein an area of a laser spot is the same as a projection area of a corresponding backlight unit on the process substrate.

10. The manufacturing method of a display panel according to claim 2, wherein the stripping of the backlight units with the filter layer on the surfaces from the process substrate comprises:

debonding the bonding glue by laser heating.

11. The manufacturing method of a display panel according to claim 1, wherein the transferring of the backlight units with the filter layer on the surfaces to the target substrate comprises:

moving the backlight units with the filter layer on the surfaces from the process substrate to the target substrate by an adsorption device with a adsorption head; and electrically connecting the backlight units with the filter layer on the surfaces to an electrode on the target substrate.

12. The manufacturing method of a display panel according to claim 11, wherein the adsorption head is an electrostatic adsorption head, a magnetic adsorption head or a vacuum adsorption head.

13. The manufacturing method of a display panel according to claim 1, wherein the packaging of the target substrate comprises:

bonding a packaging layer with the target substrate through a packaging glue, to perform packaging.

14. The manufacturing method of a display panel according to claim 1, wherein the partition is a black matrix.

15. The manufacturing method of a display panel according to claim 1, wherein the backlight units are blue light emitting diodes LEDs or ultraviolet LEDs.

16. A display panel provided according to the manufacturing method of a display panel of claim 1.

17. A display apparatus comprising the display panel according to claim 16.

* * * * *